US011914285B2

(12) United States Patent
Komura et al.

(10) Patent No.: US 11,914,285 B2
(45) Date of Patent: Feb. 27, 2024

(54) PELLICLE FRAME BODY FOR FLAT PANEL DISPLAY, AND METHOD FOR MANUFACTURING SAME

(71) Applicant: NIPPON LIGHT METAL COMPANY, LTD., Tokyo (JP)

(72) Inventors: Naoto Komura, Shizuoka (JP); Koichi Nakano, Shizuoka (JP); Akira Iizuka, Shizuoka (JP)

(73) Assignee: NIPPON LIGHT METAL COMPANY, LTD., Tokyo (JP)

( * ) Notice: Subject to any disclaimer, the term of this patent is extended or adjusted under 35 U.S.C. 154(b) by 352 days.

(21) Appl. No.: 17/269,160

(22) PCT Filed: Aug. 23, 2019

(86) PCT No.: PCT/JP2019/033109

§ 371 (c)(1),
(2) Date: Feb. 17, 2021

(87) PCT Pub. No.: WO2020/045299

PCT Pub. Date: Mar. 5, 2020

(65) Prior Publication Data

US 2021/0240072 A1 Aug. 5, 2021

(30) Foreign Application Priority Data

Aug. 28, 2018 (JP) ................................. 2018-159005

(51) Int. Cl.
*G03F 1/64* (2012.01)

(52) U.S. Cl.
CPC ...................................... *G03F 1/64* (2013.01)

(58) Field of Classification Search
CPC ........................................................ G03F 1/64
See application file for complete search history.

(56) References Cited

U.S. PATENT DOCUMENTS 9,581,897 B2 * 2/2017 Yamaguchi ............... G03F 1/64
2002/0007907 A1 * 1/2002 Arishima .................. G03F 1/62 430/4

(Continued)

FOREIGN PATENT DOCUMENTS

JP 04254856 A * 9/1992
JP 3050615 B2 * 6/2000

(Continued)

*Primary Examiner* — Mark F. Huff
*Assistant Examiner* — Moriah S. Smoot
(74) *Attorney, Agent, or Firm* — RANKIN, HILL & CLARK LLP

(57) ABSTRACT

The present invention provides an FPD pellicle frame body in which external color is controlled so as to make it easy to prevent scattering of exposure light, to perform the foreign object non-adhesion inspection before use, and the like, and a method for manufacturing the frame body efficiently. The FPD pellicle frame body of the present invention comprises: a stainless-steel member having a transparent oxide coating, and a film thickness of the transparent oxide coating being 420 nm to 700 nm. It is preferable that a brightness index L* due to the interference color of the reflected lights from the surface of the transparent oxide coating and the surface of the stainless-steel member is 33 or less.

8 Claims, 3 Drawing Sheets

(56) References Cited

U.S. PATENT DOCUMENTS

2014/0102908 A1* 4/2014 Kuroyama ........ B29C 45/14311 205/222
2014/0307237 A1* 10/2014 Sekihara ............ G03F 7/70916 355/30
2015/0205195 A1* 7/2015 Yamaguchi ........... C25D 11/16 205/209

FOREIGN PATENT DOCUMENTS

JP 2005202011 A * 7/2005
JP 2014085435 A * 5/2014

* cited by examiner

[FIG.1]
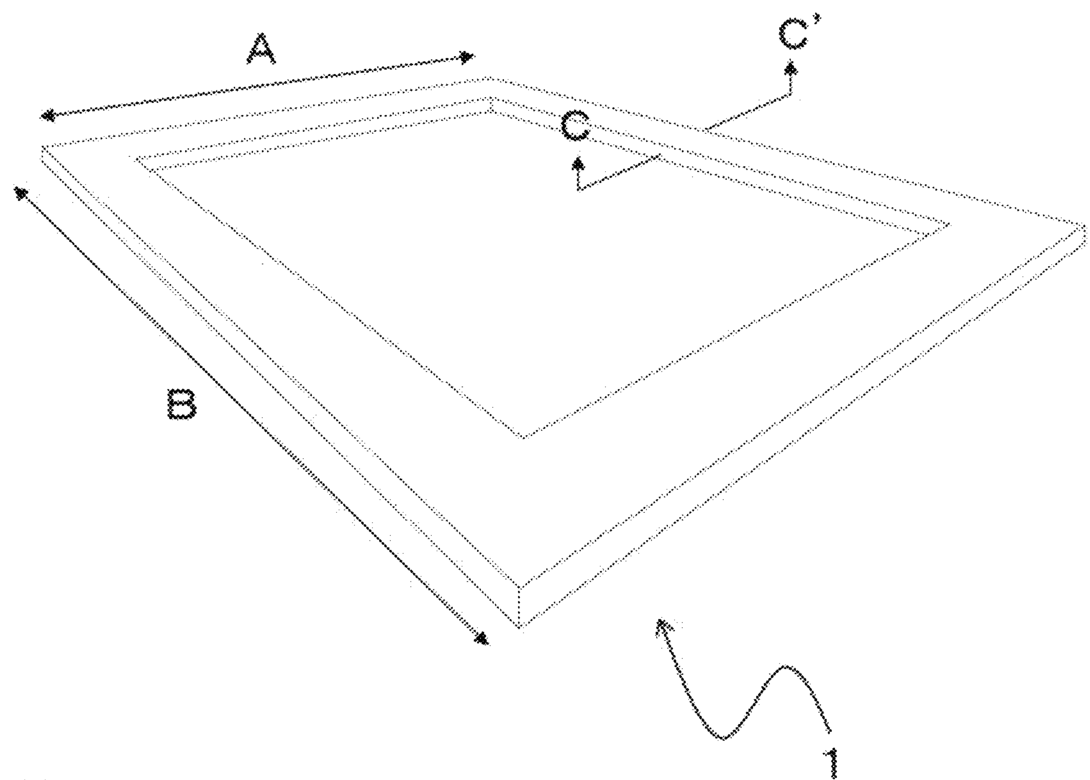
[FIG.2]
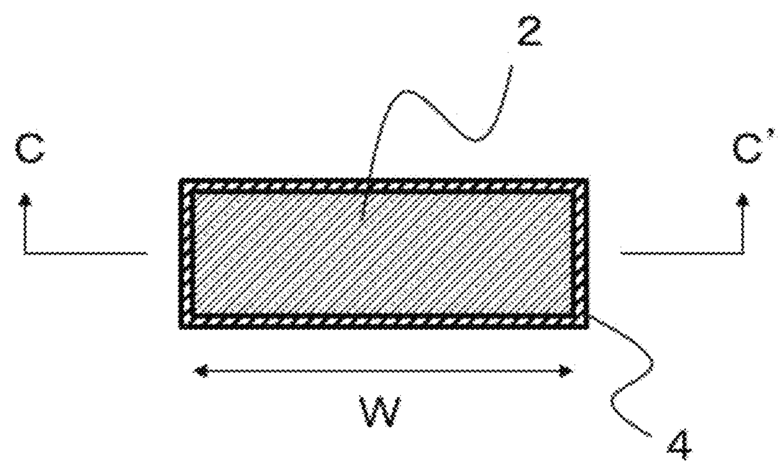

[FIG.3]
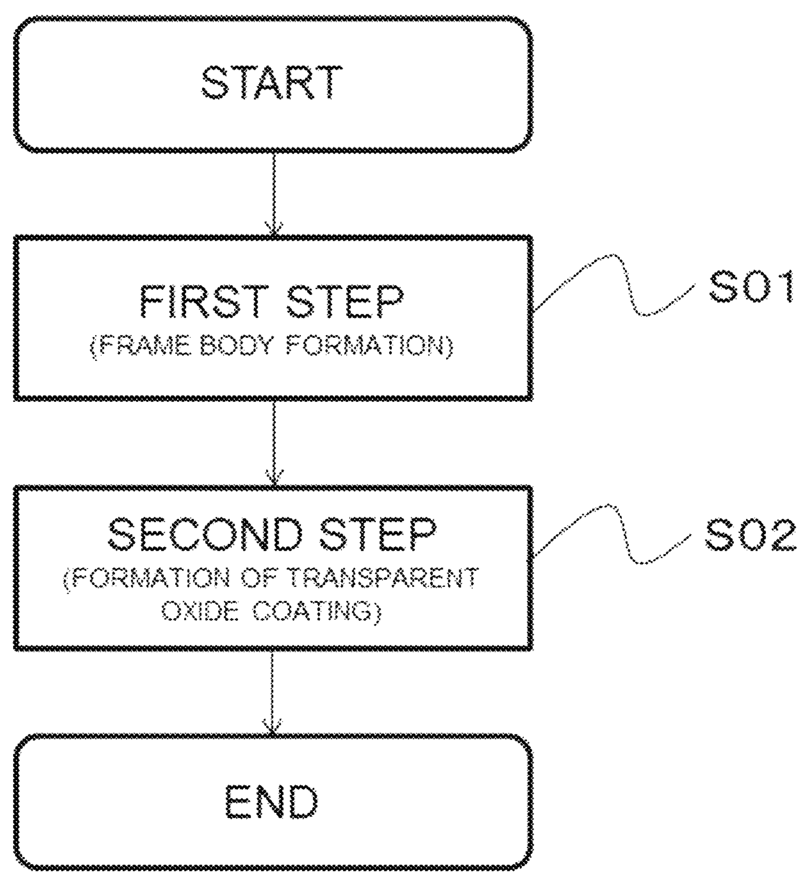

PELLICLE FRAME BODY FOR FLAT PANEL DISPLAY, AND METHOD FOR MANUFACTURING SAME

TECHNICAL FIELD

The present invention relates to a pellicle frame body for preventing foreign matters from adhering to a photomask or reticle used in a lithography process in the manufacture of a flat panel display (FPD) panel, and a method for manufacturing the pellicle, particularly relates to a pellicle frame body for a large FPD and a method for manufacturing the pellicle.

PRIOR ARTS

On the semiconductor device such as the LSI or the ultra LSI and the FPD panel, a pattern can be formed by irradiating a light to a semiconductor wafer or an original plate for FPD (pattern formation by lithography). Here, in the case of using an exposure master plate to which dust adheres, since the dust absorbs and/or inverts the light, the pattern is not transferred satisfactorily (for example, deformation of the pattern or ambiguity of the edge). As a result, the quality and appearance of the semiconductor device and the FPD panel are impaired, which results in decrease in performance and manufacturing yield.

For this reason, the lithography process is usually performed in a clean room, but, since adhesion of dust to the exposure master plate cannot be completely prevented even under such environment, usually a pellicle for protecting from dust is provided on the surface of the exposure master plate. Pellicle is composed of a pellicle frame body and a pellicle film stretched over the pellicle frame body and is placed so as to surround a pattern area formed on the surface of the exposure master plate. When the focal point is set on the pattern of the exposure master plate at the time of lithography, even if dust adheres to the pellicle film, the dust will not affect the transfer.

Here, the conventional general pellicle for semiconductors is about 150 mm square at the maximum, but the size of the pellicle is also increasing with the recent increase in the size of the FPD panel, for example, the pellicle frame body is also required having the size exceeding 1000 mm square. In addition to high dimensional accuracy and flatness, the pellicle frame body is required to have strength that does not deform due to the tension of the pellicle film, and it is becoming difficult to meet these requirements as the size of the pellicle frame increases.

Regarding to these requirements, for example, in Patent Literature 1 (JP 2009-3111 A), there is disclosed a pellicle frame made of an aluminum alloy, and the weight of this aluminum alloy is Mg: more than 3.5% and 5.5% or less, and Ti: 0.005 to 0.15%, B: 0.0005 to 0.05%, one or two kinds, Fe: 0.15% or less, Si: 0.10% or less. Regulated, the balance has a composition of Al and unavoidable impurities, and the total area ratio of the observed crystals in the field of view in the microstructure observation with a scanning electron microscope 10,000 times that of this aluminum alloy is 5% or less, and having a structure in which the diameter of the largest crystallized product observed is 3 μm or less in the equivalent circle diameter.

In the pellicle frame described in Patent Literature 1, the occurrence of white spot defects is suppressed by using a 5000 series aluminum alloy having a relatively high Mg content and a structure having few crystallizations in the pellicle frame, and in addition thereto, it is possible to provide an aluminum alloy pellicle frame for an increased size that can secure rigidity even if the thickness is relatively thin, and can cope with a remarkable increase in the size of the liquid crystal display of a flat-screen liquid crystal display television set. Has been done.

Further, in Patent Literature 2 (JP 2006-284927 A), there is disclosed a support frame includes a frame body made of an aluminum alloy and a reinforcing member made of a material having an elastic modulus larger than that of the frame body, wherein the reinforcing member is embedded in an embedded recess formed in the frame body.

In the pellicle support frame described in Patent Literature 2, since flexural rigidity and shear rigidity become higher than the case where the support frame is constituted by the frame body made of only an aluminum alloy, bending and distortion are unlikely to occur even if the size is increased. Moreover, since the reinforcing member is embedded in the embedded recess formed in the frame body, it is said that the frame body and the reinforcing member can be easily and surely integrated.

Further, the surface of the pellicle support frame needs to be blackened for the purpose of preventing reflection of light from a light source to obtain a clear pattern transfer image and facilitating foreign matter non-adhesion inspection before use, there have been proposed, for example, a method of impregnating pores of an anodic oxide film with an organic dye or the like to make it black, and a method of making it black by electrolytic precipitation after the anodic oxidation treatment (for example, Patent Literature 3: JP 2013-7762 A).

CITATION LIST

Patent Literature

Patent Literature 1: JP 2009-3111 A
Patent Literature 2: JP 2006-284927 A
Patent Literature 3: JP 2013-7762 A

SUMMARY OF INVENTION

Technical Problem

However, even with the pellicle frame described in Patent Literature 1, it is difficult to realize all requirements such as high dimensional accuracy, flatness, Young's modulus and strength which are required for a pellicle frame used for an FPD panel whose size is rapidly increasing. Particularly, in recent years, it has been strongly desired to expand the internal dimensions of the pellicle frame body in order to maximize the exposure area, but it has not been possible to secure sufficient rigidity by thinning the frame.

Further, in the support frame for a pellicle described in Patent Literature 2, it is necessary to form the embedded recess in the frame body and to integrate it with the reinforcing member, and the like, which complicates the manufacturing process and increases the cost. In addition, since different materials such as iron and titanium having a larger elastic modulus than the frame body are used for the reinforcing member, it is difficult to sufficiently ensure the processing accuracy and reliability.

Furthermore, the method of blackening the surface of the pellicle support frame is basically optimized for the pellicle support frame made of an aluminum alloy, and it is extremely difficult to apply it to the pellicle support frame made of other materials.

Considering the above problems in the prior arts, an object of the present invention is to provide an FPD pellicle frame body in which external color is controlled so as to make it easy to prevent scattering of exposure light, to perform the foreign object non-adhesion inspection before use, and the like, and a method for manufacturing the frame body efficiently.

Solution to Problem

As a result of extensive study with respect to the FPD pellicle frame body, and a method for manufacturing the pellicle frame body in order to achieve the above object, the present inventors have found that it is extremely effective to use the FPD pellicle frame body which is constituted of stainless-steel and to utilize an interference color due to the formation of the transparent oxide coating, and the present invention has been completed.

Namely, the present invention provides an FPD pellicle frame body, which comprises: a stainless-steel member having a transparent oxide coating, and a film thickness of the transparent oxide coating being 420 nm to 700 nm.

In the FPD pellicle frame body of the present invention, it is preferable that a brightness index L* due to the interference color of the reflected lights from the surface of the transparent oxide coating and the surface of the stainless-steel member is 33 or less. When the brightness index L*value is 33 or less, scattering of the exposure light can be prevented, and foreign object non-adhesion inspection before use can be easily performed.

Further, in the FPD pellicle frame body of the present invention, it is preferable that the interference color due to the reflected lights from the surface of the transparent oxide coating and the surface of the stainless-steel member is black, gray or magenta. When the appearance color of the FPD pellicle frame body is black, gray or magenta, it is possible to more easily and surely perform a foreign object non-adhesion inspection before use.

Since the FPD pellicle frame body of the present invention is made of stainless-steel, it has a higher Young ratio in comparison with the conventionally used aluminum alloy as a material for the pellicle frame body, such as a 7000 series (Al—Zn—Mg based) aluminum alloy, a 6000 series (Al—Mg—Si-based) aluminum alloy and a 5000 series (Al—Mg-based) aluminum alloy. The Young's modulus of the stainless-steel member is preferably 100 GPa or more, more preferably 150 GPa or more, and most preferably 180 GPa or more. When increasing the Young's modulus of the frame body, the rigidity can be sufficiently ensured even for a pellicle frame body for an increased size FPD, and the frame body can be made thinner than the conventional pellicle frame body.

Furthermore, the FPD pellicle frame body of the present invention is constituted of the stainless-steel member having a transparent oxide coating, and the film thickness of the transparent oxide coating is 420 nm to 700 nm. Since the transparent oxide coating having a film thickness of 420 nm to 700 nm is formed on the surface of the stainless-steel member, the brightness index L*value can be 33 or less by the interference color due to the reflected light from the surface of the transparent oxide coating and the reflected light from the surface of the stainless-steel member, and the appearance color can be made black, gray, or magenta.

Further, in the FPD pellicle frame body of the present invention, it is preferable that the stainless-steel member is an austenitic stainless-steel member. By using an austenitic stainless-steel member, the appearance color (interference color) can be changed to black, gray or magenta.

Furthermore, by using an austenitic stainless-steel member for the FPD pellicle frame body, it is possible to have both a high Young's modulus and corrosion resistance. In addition, since the austenitic stainless-steel member is rich in ductility and toughness and has good cold workability, it can be easily processed into a desired frame body shape.

Further, in the FPD pellicle frame body of the present invention, it is preferable that the stainless-steel member is a martensitic stainless-steel member. By forming the transparent oxide coating having a film thickness of 420 nm to 700 nm on the surface of the martensitic stainless-steel member, the appearance color (interference color) becomes black, and scattering of exposure light can be prevented more reliably.

Further, by using the martensitic stainless-steel member for the FPD pellicle frame body, a Young's modulus of about 200 GPa and a Vickers hardness of 400 HV or more can be obtained. In addition, the martensitic stainless-steel member is relatively inexpensive because it does not contain Ni, and the material cost of the FPD pellicle frame body can be reduced.

Further, in the FPD pellicle frame body of the present invention, it is preferable that the length of the short side is 300 mm or more and the length of the long side is 400 mm or more. The FPD pellicle frame body of the present invention is made of the stainless-steel member having a high Young's modulus and has sufficient rigidity, so that it can be used as a pellicle frame body even if the size of the frame body is increased.

The present invention provides a method for manufacturing an FPD pellicle frame body, which comprises:

- a first step for obtaining a frame body comprising a stainless-steel member, and
- a second step for forming a transparent oxide coating by immersing the frame body in a mixed solution containing chromic acid and sulfuric acid.

In the method for manufacturing an FPD pellicle frame body of the present invention, the transparent oxide coating can be formed by immersing the frame body in a mixed solution containing chromic acid and sulfuric acid, and the thickness of the transparent oxide coating can be controlled in angstrom units by the immersion time. As a result, the interference color due to the reflected light from the surface of the transparent oxide coating and the reflected light from the surface of the stainless-steel member can be easily controlled.

Further, in the method for manufacturing an FPD pellicle frame body of the present invention, it is preferable that a film thickness of the transparent oxide coating is 420 nm to 700 nm. When the film thickness of the transparent oxide coating is 420 nm to 700 nm, the appearance color of the pellicle frame body can be made black, gray or magenta by the interference color due to the reflected light from the surface of the transparent oxide coating and the reflected light from the surface of the stainless-steel member. As a result, the scattering of the exposure light can be prevented, and the foreign object non-adhesion inspection before use can be easily performed.

In the method for manufacturing an FPD pellicle frame body of the present invention, it is preferable that the stainless-steel member is of an austenitic stainless-steel or a martensitic stainless-steel. By using an austenitic stainless-steel member for the stainless-steel member, it is possible to have both a high Young's modulus and corrosion resistance, and in addition, since the austenitic stainless-steel member is rich in ductility and toughness and has good cold workability, it can be easily processed into a desired frame body shape.

Further, when using the martensitic stainless-steel member for the stainless-steel member, the appearance color (interferential color) can be surely black by forming the transparent oxide coating having the film thickness of 420 nm to 700 nm on the surface on the member. In addition, a Young's modulus of about 200 GPa and a Vickers hardness of 400 HV or more can be obtained. Furthermore, the martensitic stainless-steel member is relatively inexpensive because it does not contain Ni, and the material cost of the FPD pellicle frame body can be reduced.

Further, in the method for manufacturing an FPD pellicle frame body of the present invention, it is preferable that the frame body is formed by a solid-phase welding of the stainless-steel member in the first step. By forming the basic shape of the FPD pellicle frame body by solid-phase-welding of the stainless-steel member, the material yield can be increased, and the material cost can be reduced in comparison with the case that the FPD pellicle frame body is cut out from the stainless-steel plate.

Further, by using the solid-phase welding having a relatively low welding temperature, it is possible to suppress distortion and decrease in strength of the pellicle frame body formed by welding the rod-shaped stainless-steel members. Here, the solid-phase welding is not particularly limited as long as the effect of the present invention is not impaired, and various conventionally known solid-phase welding methods can be used, and, for example, the friction stir welding or the linear friction welding may be used preferably. By treating the welded body with cutting process, a pellicle frame body with high dimensional accuracy can be obtained.

In the friction stir welding, the welding temperature can be controlled by the rotation speed, moving speed, load, and the like of the tools for welding, thereby the structure of the welded portion can be controlled, and in addition thereto, it is also possible to control the formation of the heat-affected zone, and the like. Further, also in the linear friction welding, it is possible to perform the structural control of the welded portion, the suppression of heat-affected zone, and the like by the linear friction conditions (amplitude, frequency, load, and the like). Furthermore, in the linear friction welding, since consumable welding tools are not required, the welding cost can be reduced.

When extruded members are joined to each other by melt welding such as arc welding or laser welding, since the joint portion becomes a quench-solidified structure, the mechanical and thermal properties are different largely from those of the base material, so that it is difficult to use for a pellicle frame body that requires high dimensional accuracy and reliability, and the like. Further, in the melt welding, there is a case that small pore defects may be formed at the joint portion, but in the pellicle frame body, even extremely small defects rise a serious problem. To the contrary, since the distortion of the material to be welded by the friction stir welding or the linear friction welding is extremely small, in addition to that the joint portion (stirred portion) basically has a recrystallized structure without melt solidification, the difference from the base material can be made relatively small.

Further, in the method for manufacturing an FPD pellicle frame body of the present invention, it is preferable that the length of the short side of the final pellicle frame body is 300 mm or more, the length of the long side is 400 mm or more, and the maximum width is 6 mm or less. In the method for manufacturing an FPD pellicle frame body of the present invention, since the stainless-steel members having a high Young's modulus are joined by friction stir welding, which is a solid-phase welding, a good frame body can be obtained even if the frame body can be expanded and the plate width is reduced. From the viewpoint of expanding the internal dimensions of the FPD pellicle frame body, the maximum width of the frame is more preferably 5 mm or less.

Further, in the method for producing an FPD pellicle frame body of the present invention, it is preferable to join four stainless-steel members (bar members) having substantially the same shape and size in the first step. By unifying the shape and size of the stainless-steel member (bar members) constituting the pellicle frame body, the workability of joining can be improved and the manufacturing cost can be reduced.

Effects of the Invention

According to the present invention, it is possible to provide an FPD pellicle frame body which can easily prevent the scattering of the exposure light and perform the foreign object non-adhesion inspection before use, and a method for efficiently manufacturing the pellicle frame body.

BRIEF DESCRIPTION OF THE DRAWINGS

FIG. 1 is a perspective view showing the FPD pellicle frame body of the present embodiment.

FIG. 2 is a C-C' cross-sectional view of the FPD pellicle frame body 1 of the present embodiment.

FIG. 3 is a manufacturing step of the FPD pellicle frame body of the present embodiment.

EMBODIMENTS FOR ACHIEVING THE INVENTION

Figure 4:
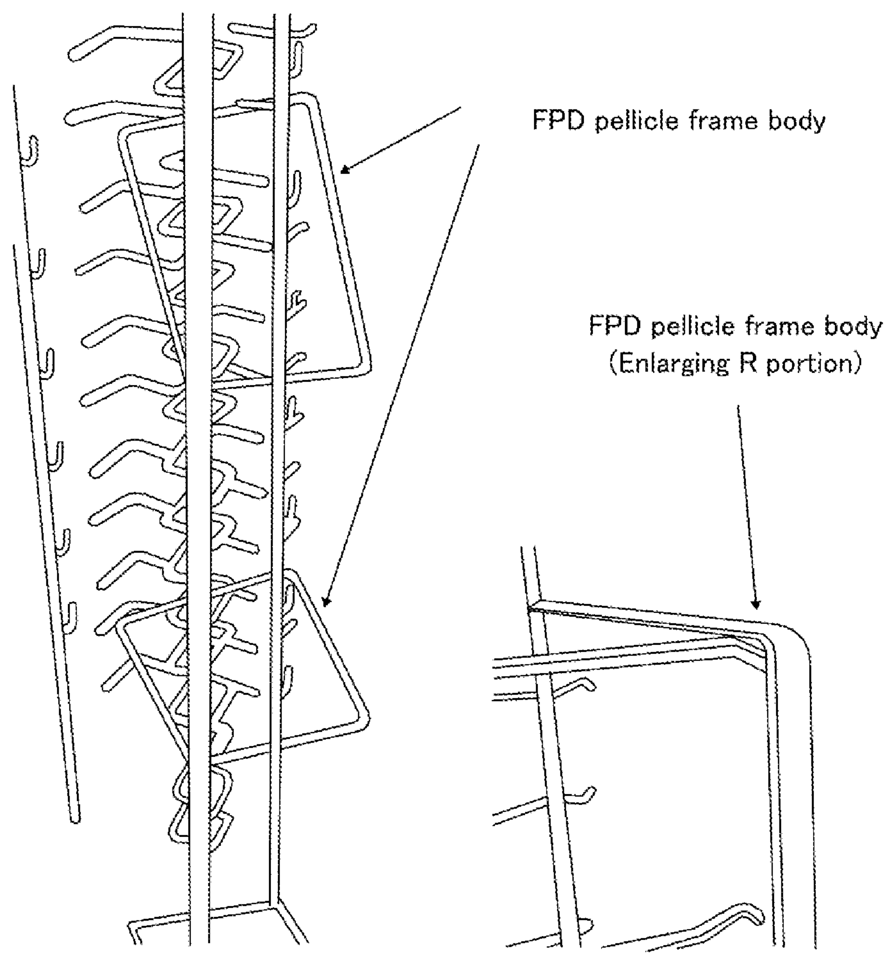
FIG. 4 is a photograph of an appearance of the FPD pellicle frame body obtained in EXAMPLE.

Hereinafter, representative embodiments of the FPD pellicle frame body, and the manufacturing method thereof according to the present invention will be described in detail with reference to the drawings, but the present invention is not limited to only these examples. Further, the elements in the embodiment can be optionally combined with a part or the whole. In the following description, the same or equivalent parts are denoted by the same numerals, and there is a case that redundant explanation may be omitted. In addition, since the drawings are for conceptually explaining the present invention, dimensions of the respective constituent elements expressed and ratios thereof may be different from actual ones.

1. FPD Pellicle Frame Body

As shown in FIGS. 1 and 2, an FPD pellicle frame body 1 is constituted of a stainless-steel member 2 having a transparent oxide coating 4. More specifically, the FPD pellicle frame body 1 includes a frame body 3 constituted of the stainless-steel member 2 (hereinafter, may be referred to as "stainless-steel frame body") and a transparent oxide coating 4 formed on the stainless-steel frame body 3. Since the FPD pellicle frame body 1 is made of stainless-steel, it has a higher Young ratio in comparison with the conventionally available aluminum alloy as a material for the pellicle frame body. The Young's modulus of the stainless-steel member is preferably 100 GPa or more, more preferably 150 GPa or more, and most preferably 180 GPa or more. When increasing the Young's modulus of the frame body, the rigidity can be sufficiently ensured even for a pellicle frame body for an increased size FPD, and the frame body can be made thinner than the conventional pellicle frame body.

Since the stainless-steel frame body 3 is made of a stainless-steel member having a high Young modulus, the rigidity required for the pellicle frame body 1 for the increased size FPD can be maintained even if the cross-sectional area of the stainless-steel frame body 3 is reduced, and by reducing the cross-sectional area, the inner dimensions of the frame body can be expanded, and in addition, the FPD pellicle frame body 1 having high dimensional accuracy and flatness can be obtained.

The stainless-steel member used for the stainless-steel frame body 3 is not particularly limited as long as the effects of the present invention are not impaired, and various conventionally known stainless-steel members can be used, and from the viewpoint of ensuring corrosion resistance, the austenitic stainless-steel member may be preferably used, and from the viewpoint of young modulus and hardness, the martensitic stainless-steel member may be preferably used.

Here, examples of the austenitic stainless-steel member include SUS301, SUS301L, SUS301J1, SUS302B, SUS303, SUS304, SUS304Cu, SUS304L, SUS304N1, SUS304N2, SUS304LN, SUS304J1, SUS304J2, SUS305, SUS3095, SUS310S, SUS312L, SUS315J1, SUS315J2, SUS316, SUS316L, SUS316LN, SUS316Ti, SUS316J1, SUS316J1L, SUS317, SUS317L, SUS317LN, SUS317J1, SUS317J2, SUS836L, SUS890L, SUS321, SUS347, SUSSXM7, SUSXM15J1, which are defined by JIS standards.

Further, examples of the martensitic stainless-steel member include SUS403, SUS410, SUS410S, SUS420J1, SUS420J2, SUS440A, which are defined by JIS standards.

The stainless-steel frame body 3 is obtained, for example, by cutting out from a stainless-steel plate, and preferably does not have a region having different characteristics such as a joint portion, and when having a joint portion, the joint portion is preferably a solid-phase welded portion. The melt welded portion becomes a quench-solidified structure and the mechanical and thermal properties thereof are different largely from those of the base material, but the solid-phase joint portion basically has a recrystallized structure, the difference of the mechanical properties from the base material can be made small. In addition, since the heat input during the solid-phase welding is relatively small, it is possible to suppress significant distortion and decrease in strength of the pellicle frame body.

The length of the short side (Ain FIG. 1) of the FPD pellicle frame body 1 is usually 300 mm or more, preferably 500 mm or more, more preferably 700 mm or more, and the upper limit is not particularly limited, but is usually 3000 mm or less. The length of the long side (B in FIG. 1) of the FPD pellicle frame body 1 is usually 400 mm or more, preferably 600 mm or more, more preferably 900 mm or more, and the upper limit is not particularly limited, but is usually 4000 mm or less. When the lengths of the short side and the long side of the FPD pellicle frame body 1 are not less than the above lower limit value, it is easy to suppress the influence of dust on the exposure original plate for the FPD panel of the increased size. Further, in the FPD pellicle frame body 1, the stainless-steel frame body 3 is made of the stainless-steel member having a high Young's modulus, so that it can be used as a pellicle frame body even if the size of the frame body is increased.

The maximum width (W in FIG. 2) of the frame of the FPD pellicle frame body 1 is preferably 6 mm or less, and more preferably 5 mm or less. Since the FPD pellicle frame body 1 is made of a stainless-steel member 2 having a high Young's modulus, rigidity can be ensured even if the frame width is reduced. Here, by setting the maximum width of the frame to 6 mm or less, exposure defects in the vicinity of the frame body can be suppressed, and by setting it to 5 mm or less, the internal dimensions of the FPD pellicle frame body 1 can be further expanded.

The transparent oxide coating 4 is formed on the surface of the stainless-steel frame body 3. The film thickness of the transparent oxide coating 4 is usually 420 nm or more, preferably 430 nm or more, more preferably 440 nm or more, further preferably 450 nm or more, particularly preferably 460 nm or more, and usually 700 nm or less, preferably 600 nm or less, more preferably. It is 550 nm or less, more preferably 500 nm or less, and particularly preferably 480 nm or less. By setting the film thickness of the transparent oxide coating 4 within the above range, the brightness index L* of the FPD pellicle frame body 1 is determined to a desired value by the interference color due to the reflected light from the surface of the transparent oxide coating 4 and the reflected light from the surface of the stainless-steel member 2, and the appearance color can be black, gray, or magenta. Being different from general coatings, since the film thickness of the transparent oxide coating 4 is extremely thin, the influence of the film on the dimensional accuracy of the FPD pellicle frame body 1 can be minimized. In the present specification, the film thickness of the transparent oxide coating 4 means a value measured by the method described in Example.

The brightness index L* value of the FPD pellicle frame body 1 is usually 33 or less, preferably 32 or less, more preferably 31 or less, and particularly preferably 30 or less. When the brightness index L* value is within the above range, scattering of the exposure light is easily prevented, and foreign object non-adhesion inspection before use is easily performed. In the present specification, the brightness index L* value means a value measured by the method described in Example.

Further, since the appearance color of the FPD pellicle frame body 1 is not colored by a dye or pigment, but is colored by the interference color due to the reflected light from the surface of the transparent oxide coating 4 and the reflected light from the surface of the stainless-steel member 2, the color would not change even when exposed by a strong light for a long time.

The composition and microstructure of the transparent oxide coating 4 are not particularly limited as long as the effects of the present invention are not impaired, and it is preferable that, by adjusting the film thickness, the brightness index L* value of the FPD pellicle frame body 1 is set to a desired value. Further, it is more preferable that the transparent oxide coating 4 is a porous oxide coating formed on the surface of the stainless-steel member 2 in which the pores generated in the porous oxide coating are closed. Such a transparent oxide coating 4 can be obtained by immersing the stainless-steel frame body 3 (stainless-steel member 2) in the heated mixed solution of chromium acid and sulfuric acid to obtain the transparent porous oxide coating, and further, depositing chromium oxide in the pores of the porous oxide coating. By closing the pores of the transparent porous oxide coating with chromium oxide, the film hardness and corrosion resistance can be improved.

Further, the transparent oxide coating 4 is preferably a grown oxide coating of the stainless-steel member 2 itself.

As a result, since the coating is not formed by, for example, plating coating where other substances are not adhered to the metal surface, the transparent oxide coating 4 has extremely good adhesion, and thus the transparent oxide coating 4 can also be bent or lightly pressed after the formation.

The cross-sectional shape of the FPD pellicle frame body 1 is not particularly limited as long as the effect of the present invention is not impaired, and may be various conventionally known shapes, and preferable is a quadrilateral where the upper side on which the pellicle film is stretched and the lower side on which the adhesive layer for adhesion is provided are parallel. The upper side of the FPD pellicle frame body 1 needs a width for stretching the pellicle film, and the lower side needs a width for providing an adhesive layer for adhesion and adhering to the exposure original plate.

The flatness of the FPD pellicle frame body 1 is preferably 150 μm or less, more preferably 100 μm or less. By improving the flatness of the FPD pellicle frame body 1, the amount of deformation of the FPD pellicle frame body 1 when the pellicle is attached to the exposure original plate can be reduced. In this specification, the flatness is determined by measuring the height at four points at each corner of the FPD pellicle frame body 1 and four points at the center of the four sides, i.e. eight points in total, to calculate a virtual plane, and then calculating from a difference obtained by subtracting the lowest point from the highest point among the distances of each point from the virtual plane.

Further, various pellicles can be provided by using the FPD pellicle frame body 1. The pellicle of the present embodiment includes the FPD pellicle frame body 1 and a pellicle film provided on the upper surface of the FPD pellicle frame body 1. Further, the pellicle may be provided with a protective film provided on the lower surface of the FPD pellicle frame body 1. Such a pellicle can be obtained, for example, by covering the upper surface of the FPD pellicle frame body 1 with a transparent pellicle film, providing an adhesive layer on the lower surface of the FPD pellicle frame body 1, and covering the lower surface of the adhesive layer with the protective film in the peelable manner. According to the FPD pellicle frame body 1 of the present embodiment, since the frame body 3 made of the stainless-steel member 2 is provided, when the pellicle is formed, even if the width of the frame body 3 is increased by expanding the internal dimensions of the frame body 3 to narrow the width, distortion and the like do not easily occur through maintaining rigidity. The FPD pellicle frame body 1 can be blackened by various conventionally known surface treatments and surface coatings, and the problem that the reflection of light during exposure makes the transfer pattern unclear can be avoided.

2. Method for Manufacturing FPD Pellicle Frame Body

As shown in FIG. 3, the method of manufacturing the FPD pellicle frame body of the present embodiment includes the first step (S01) for obtaining a frame body comprising a stainless-steel member, and the second step (S02) for forming a transparent oxide coating by immersing the frame body in a mixed solution containing chromic acid and sulfuric acid. Hereinafter, each step including any optional step will be described in detail.

(1) First Step (S01: Step for Forming Frame Body)

The first step (S01) is a step for obtaining the stainless-steel frame body 3, and in this step, the stainless-steel frame body 3 for the FPD pellicle frame body 1 is obtained with high dimensional accuracy by subjecting the stainless-steel member 2 to joining or cutting as occasion demand.

When the stainless-steel member 2 has a sufficient size, the stainless-steel frame body 3 can be cut out from the stainless-steel member 2. On the other hand, the stainless-steel frame 3 can also be obtained by solid-phase-welding the stainless-steel member 2, and in this case, the yield of the stainless-steel member 2 can be increased. The stainless-steel frame body 3 obtained by cutting out or solid-phase welding may be subjected to further cutting process. Hereinafter, the step of obtaining the stainless-steel frame body 3 by using solid-phase welding is described in detail.

1. Solid-Phase Welding of Stainless-Steel Member

Solid-phase welding of the stainless-steel member is an arbitrary step, and is a step for solid-phase-welding the stainless-steel member 2 to obtain a bonded body having a shape close to the shape of the FPD pellicle frame body 1. By forming the basic shape of the FPD pellicle frame body 1 by solid-phase-welding of the stainless-steel member 2, the material yield can be increased, and the material cost can be reduced in comparison with the case that the FPD pellicle frame body 1 is cut out from the stainless-steel plate.

Further, by using the solid-phase welding having a relatively low welding temperature, it is possible to suppress distortion and decrease in strength of the pellicle frame body formed by welding the rod-shaped stainless-steel members 2. Here, the solid-phase welding is not particularly limited as long as the effect of the present invention is not impaired, and various conventionally known solid-phase welding methods can be used, and, for example, the friction stir welding or the linear friction welding may be used preferably.

In the friction stir welding, the welding temperature can be controlled by the rotation speed, moving speed, load, and the like of the tools for welding, thereby the structure of the welded portion can be controlled, and in addition thereto, it is also possible to control the formation of the heat-affected zone, and the like. Further, also in the linear friction welding, it is possible to perform the structural control of the welded portion, the suppression of heat-affected zone, and the like by the linear friction conditions (amplitude, frequency, load, and the like). Furthermore, in the linear friction welding, since consumable welding tools are not required, the welding cost can be reduced.

When welding the stainless-steel member 2 by the friction stir welding, it is necessary to use a welding tool made of a material having a higher strength than the stainless-steel member 2 at the welding temperature. The material of the welding tool is not particularly limited as long as friction stir welding is achieved, and for example, cemented carbide, ceramics such as silicon nitride and pc-BN, and metals having a high melting point such as W-Re can be used.

Here, when extruded members are joined to each other by melt welding such as arc welding or laser welding, since the joint portion becomes a quench-solidified structure, the mechanical and thermal properties are different largely from those of the base material, so that it is difficult to use for a method for manufacturing the FPD pellicle frame body 1 that requires high dimensional accuracy and reliability, and the like. Further, in the melt welding, there is a case that small pore defects may be formed at the joint portion, but in the FPD pellicle frame body 1, even extremely small defects rise a serious problem. To the contrary, since the distortion of the material to be welded by the friction stir welding or the linear friction welding is extremely small, in addition to that the joint portion (stirred portion) basically has a recrystallized structure without melt solidification, the difference from the base material can be made relatively small.

As mentioned above, the stainless-steel member 2 used for the FPD pellicle frame body 1 is not particularly limited as long as the effects of the present invention are not impaired, and various conventionally known stainless-steel members can be used, and from the viewpoint of ensuring corrosion resistance, the austenitic stainless-steel member may be preferably used, and from the viewpoint of young modulus and hardness, the martensitic stainless-steel member may be preferably used.

Further, when the stainless-steel frame body 3 is formed by joining the stainless-steel member 2, it is preferable to join four stainless-steel members 2 having substantially the same shape and size in the first step. By unifying the shape and size of the stainless-steel member 2 constituting the pellicle frame body, the workability of joining can be improved and the manufacturing cost can be reduced.

2. Cutting Process of Joint Body

The shape of the stainless-steel frame body 3 and the final FPD pellicle frame body 1 can be obtained by applying the cutting process to the joint body of the stainless-steel member 2 obtained in the preliminary step 1.

With respect to the frame body after the cutting process, it is preferable that the length of the short side is 300 mm or more, the length of the long side is 400 mm or more, and the maximum width is 6 mm or less. The FPD pellicle frame body 1 requires uniform and high rigidity as a whole, and even in the case that there is the joint portion, since the stainless-steel members 2 having a high Young's modulus are joined by the solid-phase welding, a good frame body can be obtained even if the frame body can be expanded and the plate width is reduced. From the viewpoint of expanding the internal dimensions of the FPD pellicle frame body 1, the maximum width of the frame is more preferably 5 mm or less.

Here, when strain or the like due to joining becomes a problem, it is preferable to perform cutting process after press-annealing the joint body. Compared with the case of using melt welding, the strain of the frame body obtained by the solid-phase welding is smaller, but the FPD pellicle frame 1 is required to have extremely high dimensional accuracy. Regarding to this matter, by heat-annealing the joint body to remove the internal strain, the dimensional accuracy of the frame body after cutting process can be further improved.

(2) Second Step (S02: Step for Forming Transparent Oxide Coating)

In the second step (S02), the stainless-steel frame body 3 obtained in the first step (S01) is immersed in a mixed solution containing chromic acid and sulfuric acid to form the transparent oxide coating. The appearance color of the FPD pellicle frame body 1 can be determined by the second step (S02).

By immersing the stainless-steel frame body 3 in a heated mixed color-developing solution of chromic acid and sulfuric acid, the transparent oxide coating 4 can be formed on the surface of the stainless-steel member 2. The oxide coating grown in the mixed color-developing solution is porous, and the film hardness and corrosion resistance may not be sufficient as it is. Here, when the film hardness or corrosion resistance is not sufficient, it is preferable to electrolyze the product as a cathode in a chromic acid-based solution after washing with water to precipitate chromium oxide in the pores of the oxide coating to close the pores.

The appearance color of the FPD pellicle frame 1 can be controlled by the film thickness of the transparent oxide coating 4, and the film thickness of the transparent oxide coating 4 is preferably in the range of 420 nm to 700 nm. Though, by setting the film thickness of the transparent oxide coating 4 to 420 nm to 700 nm, the brightness index *L value of the FPD pellicle frame body 1 can be 33 or less, since the value may change slightly depending on the surface condition of the stainless-steel frame body, it is preferable to finely adjust the film thickness of the transparent oxide coating 4 according to a desired value and appearance color.

Here, the film thickness of the transparent oxide coating 4 can be adjusted in units of angstrom. Specifically, the potential difference (mV unit) between the stainless-steel frame body and the platinum measurement electrode is measured in the mixed color-developing solution, and the immersion time is determined by utilizing the fact that the potential difference changes according to the growth of the transparent oxide coating 4.

The color that can be developed by the transparent oxide coating 4 depends on the kind of stainless-steel, and in the case of the austenitic stainless-steel member, it can be amber, blue, gray, gold, magenta, green and its intermediate colors, black, and black, gray or magenta may be preferable. Further, in the case of the martensitic stainless-steel member, in principle, only black is developed.

The representative embodiments of the present invention have been described above, but the present invention is not limited only to these embodiments, and various design changes are possible, and all such design changes are included in the technical scope of the present invention.

EXAMPLES

Example

A plate of JIS-SUS303 was cut to obtain a stainless-steel frame body having a long side of 940 mm, a short side of 760 mm, a frame width of 6 mm, and a frame thickness of 6 mm.

Next, after the stainless-steel frame body was degreased and washed with water, the frame body was immersed in a mixed color-developing solution (mixed solution of chromic acid and sulfuric acid) available from Toyo Rikagaku Kenkyusho Co., Ltd. for 75 seconds to form a transparent oxide coating. Thereafter, an FPD pellicle frame body was obtained by washing with water and drying. The film thickness of the transparent oxide coating of the FPD pellicle frame body of this Example was 490 nm. In this Example, the film thickness of the transparent oxide coating was measured by scanning the cross section of the sample obtained by cutting the FPD pellicle frame body with a scanning electron microscope (SEM) (available from Hitachi, Ltd., Model number: S-4500), and the film thicknesses of the upper surface, inner side surface, and outer surface were calculated from the observation photographs, and the average value of these film thicknesses was obtained. A photograph of the appearance of the obtained FPD pellicle frame body is shown in FIG. 4. No distortion or scratches are observed in the FPD pellicle frame body, and it is clear that the FPD pellicle frame body with an increased size which has sufficient rigidity and dimensional accuracy is obtained. In addition, the appearance color of the FPD pellicle frame was magenta.

The brightness index L* values of two short sides and two long sides, i.e. four locations in total, of the FPD pellicle frame body were measured. In this Example, the brightness index L* value was measured by measuring the surface of the FPD pellicle frame body with a spectral color difference meter (available from Nippon Denshoku Kogyo Co., Ltd.

Model number: NF777) and averaging the measured values of each side. Each measured value and the average value are shown in TABLE 1. The maximum brightness index L* value is 32.01, which shows that the values are 33 or less in all regions.

TABLE 1

| | Measured location | L value | Average L value |
|---|---|---|---|
| Ex. | Short side 1 | 31.10 | 31.69 |
| | Long side 1 | 32.01 | |
| | Short side 2 | 31.94 | |
| | Long side 2 | 31.71 | |
| Com. Ex. 1 | Short side 1 | 36.03 | 36.65 |
| | Long side 1 | 38.04 | |
| | Short side 2 | 36.57 | |
| | Long side 2 | 35.94 | |
| Com. Ex. 2 | Short side 1 | 34.21 | 34.59 |
| | Long side 1 | 34.16 | |
| | Short side 2 | 34.55 | |
| | Long side 2 | 35.45 | |

When the obtained FPD pellicle frame body was subjected to a tensile test and the Young's modulus was determined from the stress-strain curve, the modulus was 198.8 GPa. The tensile strength was 617 MPa and the 0.2% proof stress was 236 MPa. The Young's modulus of the conventionally known FPD pellicle frame body made of A5052 aluminum alloy is around 69 GPa, and it is clear that the obtained FPD pellicle frame body has a high Young's modulus. In this Example, the tensile test was measured by using a tensile tester (available from Shimadzu Corporation, Model number AG-IS 100 kN). Tensile strength, proof stress, and elongation were measured according to JIS Z2241. Young's modulus was determined from the stress-elongation curve. The conditions of the tensile test were that the crosshead displacement speed was 0.5 mm/min until Young's modulus and proof stress measurement, and thereafter, was at 5 mm/min.

Comparative Example 1

An FPD pellicle frame body was obtained in the same manner as in Example except that the immersion time in the mixed color-developing solution was 50 seconds. The film thickness of the transparent oxide coating of the FPD pellicle frame body of Comparative Example 1 was 400 nm.

Further, the brightness index L* value was measured in the same manner as in Example. The obtained each measured value and the average value thereof are shown in TABLE 1. The appearance color of the FPD pellicle frame body is blue, and the brightness index L* value is 35 or more.

Comparative Example 2

An FPD pellicle frame body was obtained in the same manner as in Example except that the immersion time in the mixed color-developing solution was 65 seconds. The film thickness of the transparent oxide coating of the FPD pellicle frame body of Comparative Example 2 was 220 nm.

Further, the brightness index L* value was measured in the same manner as in Example. The obtained each measured value and the average value thereof are shown in TABLE 1. The appearance color of the FPD pellicle frame body is blue, and the brightness index L* value is 34 or more.

EXPLANATION OF SYMBOLS

1: FPD pellicle frame body,
2: Stainless steel member,
3: Frame body of stainless steel (frame body),
4: Transparent oxide coating layer.

The invention claimed is:

1. A pellicle frame body for flat panel display (FPD), comprising:
- a stainless-steel member; and
- a transparent oxide coating in direct contact with the stainless-steel member,
- wherein a film thickness of the transparent oxide coating is 420 nm to 700 nm.

2. The pellicle frame body according to claim 1, wherein a brightness index L* due to an interference color between a reflected light from a surface of the transparent oxide coating and a reflected light from a surface of the stainless-steel member is 33 or less.

3. The pellicle frame body according to claim 1, wherein the interference color is black, gray or magenta.

4. The pellicle frame body according to claim 1, wherein the stainless-steel member is an austenitic stainless-steel member.

5. The pellicle frame body according to claim 1, wherein the stainless-steel member is a martensitic stainless-steel member.

6. The pellicle frame body according to claim 1, wherein the length of the short side is 300 mm or more and the length of the long side is 400 mm or more.

7. The pellicle frame body according to claim 1, wherein the transparent oxide coating comprises a transparent porous oxide coating and chromium oxide closing pores of the transparent porous oxide coating.

8. The pellicle frame body according to claim 1, wherein the transparent oxide coating is a grown oxide coating of the stainless-steel member itself.

* * * * *